(12) United States Patent
Kim et al.

(10) Patent No.: US 11,708,499 B2
(45) Date of Patent: Jul. 25, 2023

(54) METHOD OF MANUFACTURING HIGHLY CONDUCTIVE POLYMER THIN FILM INCLUDING PLURALITY OF CONDUCTIVE TREATMENTS

(71) Applicant: Industry-University Cooperation Foundation Hanyang University, Seoul (KR)

(72) Inventors: Tae Whan Kim, Seoul (KR); Na Hyun Park, Seoul (KR); Dae Hun Kim, Seoul (KR)

(73) Assignee: INDUSTRY—UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 412 days.

(21) Appl. No.: 16/957,506

(22) PCT Filed: Nov. 19, 2018

(86) PCT No.: PCT/KR2018/014189
§ 371 (c)(1),
(2) Date: Jun. 24, 2020

(87) PCT Pub. No.: WO2019/177223
PCT Pub. Date: Sep. 19, 2019

(65) Prior Publication Data
US 2021/0054217 A1     Feb. 25, 2021

(30) Foreign Application Priority Data
Mar. 13, 2018   (KR) ........................ 10-2018-0029123

(51) Int. Cl.
*C09D 5/24* (2006.01)
*C09D 7/63* (2018.01)
(Continued)

(52) U.S. Cl.
CPC ................. *C09D 5/24* (2013.01); *C09D 7/63* (2018.01); *C09D 165/00* (2013.01); *H01B 1/127* (2013.01); *C08K 5/29* (2013.01); *C08K 2201/001* (2013.01)

(58) Field of Classification Search
CPC ........... C08L 2203/204; C08L 2203/20; H01B 1/127; H01L 31/022425; C09D 5/24
See application file for complete search history.

(56) References Cited

FOREIGN PATENT DOCUMENTS

| CN | 206250196 | * | 6/2017 |
| KR | 10-2009-0119746 A | | 11/2009 |

(Continued)

OTHER PUBLICATIONS

Kim, J. Y. et al., Enhanced efficiency of polymer: fullerence bulk heterojunction solar cells with the insertion of thin Pyronin B layer near the Al electrode. Proc. SPIE 5938. Organic Photovoltaics VI. 59381I, Oct. 3, 2005.

(Continued)

*Primary Examiner* — Tabassom Tadayyon Eslami
(74) *Attorney, Agent, or Firm* — NKL Law; Jae Youn Kim

(57) ABSTRACT

A method of manufacturing a highly conductive polymer thin film is proposed. The method includes a step of coating a substrate with a first dopant solution including a polymer material and a first dopant to form a conductive polymer thin film subjected to first conductive treatment; and a step of performing second conductive treatment using a second dopant solution including pyronin B on the conductive polymer thin film to form a highly conductive polymer thin film.

15 Claims, 15 Drawing Sheets

(51) Int. Cl.
C09D 165/00 (2006.01)
H01B 1/12 (2006.01)
C08K 5/29 (2006.01)

(56) References Cited

FOREIGN PATENT DOCUMENTS

| KR | 10-1022208 B1 | 3/2011 |
| KR | 10-2011-0107576 A | 10/2011 |
| KR | 10-2012-0011479 A | 2/2012 |
| KR | 10-2012-0096342 | * 8/2012 |
| KR | 10-2012-0096342 A | 8/2012 |
| KR | 10-1282564 B1 | 7/2013 |
| WO | WO 2012/137916 | * 10/2012 |

OTHER PUBLICATIONS

Qian, Yueyue et al., High performance electrochemical electrode based on polymeric composite film for sensing of dopamine and catechol. Sensors and Actuator B: Chemical. vol. 255, Part 2, pp. 1655-1662, Feb. 2018.

Zhimeng Yu et al., PEDOT:PSS Films with Metallic Conductivity through a Treatment with Common Organic Solutions of Organic Salts and Their Application a s a Transparent Electrode of Polymer Solar Cells, Applied Materials & Interfaces, pp. 11629-11638.

* cited by examiner

METHOD OF MANUFACTURING HIGHLY CONDUCTIVE POLYMER THIN FILM INCLUDING PLURALITY OF CONDUCTIVE TREATMENTS

CROSS-REFERENCE TO RELATED APPLICATIONS

This application is a National Stage Entry of PCT International Application No. PCT/KR2018/014189, which was filed on Nov. 19, 2018, and which claims priority to Korean Patent Application No. 10-2018-0029123, filed on Mar. 13, 2018 in the Korean Intellectual Property Office, the disclosure of which is incorporated herein by reference.

TECHNICAL FIELD

The present invention relates to a method of manufacturing a highly conductive polymer thin film, and more particularly, to a method of manufacturing a highly effective high-conductivity polymer thin film wherein a work function is controlled by a simple solution process.

BACKGROUND ART

Transparent electrodes are essential components of flexible electronic devices, displays such as LCDs and OLED displays, touch panels and thin-film solar cells. Currently, indium tin oxide (ITO) is mostly used as a material of transparent electrodes. However, research and development of flexible transparent electrodes capable of replacing ITO are being actively conducted due to a rise in price due to the scarcity of indium and the lack of mechanical flexibility required for a next-generation flexible electronic device. Many studies have been conducted on carbon-based materials such as carbon nanotubes, graphene, metal-based materials such as metal meshes, metal nanowires, and ultra-thin metals, metal oxides, and the like as candidate materials for ITO. However, transparent electrodes developed so far have remarkably low conductivity, which should be rapidly overcome.

In particular, since the shape of a flexible electronic device may be changed, space utilization may be increased. In addition, a flexible electronic device is thin, light, and unbreakable, and research thereon is being actively conducted. Since ITO, which has been mainly used as an electrode for electronic devices, cracks when bent or warped, there are difficulties in applying the same to flexible devices. Accordingly, there is a need for research on a flexible electrode that can replace ITO.

Ag nanowires, which are being researched as a next-generation flexible electrode, have excellent optical properties and flexibility and high electrical conductivity, thereby attracting attention as a material for transparent electrodes. However, in the case of electrodes made of Ag nanowires, there are difficulties in applying the same to a display device due to a haze phenomenon. In addition, dark current increases due to poor surface roughness so that efficiency is decreased upon manufacture of an optoelectronic device.

CNT is an ideal material in having all of the advantages of polymers, carbon fibers and metals such as excellent mechanical strength, rigidity, and thermal and electrical conductivity and low density. However, in the case of CNT, technology for separating CNT according to the characteristics of each device is required. However, since CNT is very small, it is difficult to uniformly disperse CNT and many studies on such dispersion are required.

Among conductive polymers, research on PEDOT:PSS is mainly being conducted. PEDOT:PSS is actively being studied as a material for next-generation flexible transparent electrodes. PEDOT:PSS mainly used in organic electronic devices has a problem of exhibiting low electrical conductivity. Accordingly, a technique of adding a secondary organic solvent to PEDOT:PSS to reduce an electrical conductivity to a level of 500 to 1,000 S/cm has been studied. DMSO, NMP, EG, MeOH, EtOH, or IPA is mainly being used as an organic solvent. Such organic solvents improve crystallization of PEDOT:PSS, increasing electrical conductivity by 100 to 1,000 times. Such PEDOT:PSS is being applied to flexible electronic devices. However, the organic solvent-added PEDOT:PSS still has very low electrical conductivity compared to existing electrodes. Therefore, research into further increasing electrical conductivity is required to replace existing electrodes.

DISCLOSURE

Technical Problem

Therefore, the present invention has been made in view of the above problems, and it is one object of the present invention to provide a method of manufacturing a high-efficiency high-conductivity polymer thin film. According to the method of the present invention, by performing first conductive treatment using a first dopant and second conductive treatment using pyronin B, the work function of a highly conductive polymer thin film may be controlled, thereby increasing the efficiency of the highly conductive polymer thin film.

It is another object of the present invention to provide a method of manufacturing a highly conductive polymer thin film having high transmittance and high conductivity. According to the method of the present invention, by performing first conductive treatment using a first dopant and second conductive treatment using pyronin B, a highly conductive polymer thin film having high transmittance and high conductivity may be manufactured.

It is yet another object of the present invention to provide a method of manufacturing a highly conductive polymer thin film having improved conductivity. According to the method of the present invention, second conductive treatment using pyronin B is performed to separate the phases of a polymer material, thereby inducing connection between grains. As a result, crystallization of the polymer material may be affected, and thus a highly conductive polymer thin film having improved conductivity may be manufactured.

Technical Solution

In accordance with one aspect of the present invention, provided is a method of manufacturing a highly conductive polymer thin film, the method including a step of coating a substrate with a first dopant solution including a polymer material and a first dopant to form a conductive polymer thin film subjected to first conductive treatment; and a step of performing second conductive treatment using a second dopant solution including pyronin B on the conductive polymer thin film to form a highly conductive polymer thin film.

The pyronin B may separate phases of the polymer material to induce connection between grains.

A sheet resistance of the highly conductive polymer thin film may be controlled by a concentration of the pyronin B.

The concentration of the pyronin B may be 0.0001 wt % to 0.1 wt %.

A volume ratio of the polymer material to the first dopant may be 10:1.

The second dopant solution may further include the first dopant.

The method may further include a first heat treatment step of heat-treating, at a temperature of 120° C. to 150° C., the conductive polymer thin film that has been subjected to the first conductive treatment.

The method may further include a second heat treatment step of heat-treating, at a temperature of 120° C. to 150° C., the highly conductive polymer thin film that is the conductive polymer thin film that has been subjected to the second conductive treatment.

The method may further include a step of performing patterning of the highly conductive polymer thin film to form transparent electrodes.

The polymer material may include at least one of polythiophene-based materials, polypyrrole-based materials, polyphenylene-based materials, polyaniline-based materials, and polyacetylene-based materials.

The polymer material may be polyethylene dioxythiophene:polystyrene sulfonate (PEDOT:PSS).

The first dopant may be a polar solvent including at least one of dimethyl sulfoxide (DMSO), diethylene glycol monoethyl ether, isophorone, propylene carbonate, cyclohexanone, butyrolactone, hydrochloric acid (HCl), N-methylpyrrolidone (NMP), N,N-dimethylformamide (DMF), and N-dimethylacetamide (DMA).

The substrate may include at least one of glass, quartz, sapphire, aluminum oxide ($Al_2O_3$), polydimethylsiloxane (PDMS), polyethersulfone (PES), polyethylene naphthalate (PEN), polystyrene, polyethylene terephthalate (PET), polyamide (PI), polyvinyl chloride (PVC), polyvinylpyrrolidone (PVP), polyethylene (PE), polyacrylic acid, polyester (PS), and polyurethane (PU).

The conductive polymer thin film may be formed using at least one of blade coating, bar coating, spray coating, spin coating, brush coating, dip coating, and gravure coating.

The step of forming the highly conductive polymer thin film may be performed using a dipping method or a spraying method.

In accordance with another aspect of the present invention, provided is a highly conductive polymer thin film manufactured by the method according to the present invention, wherein a sheet resistance value of the highly conductive polymer thin film is 200Ω/□ or less.

Advantageous Effects

According to an embodiment of the present invention, by performing first conductive treatment using a first dopant and second conductive treatment using pyronin B, the work function of a highly conductive polymer thin film can be controlled. Thereby, a high-efficiency high-conductivity polymer thin film can be manufactured.

According to an embodiment of the present invention, by performing first conductive treatment using a first dopant and second conductive treatment using pyronin B, a highly conductive polymer thin film having high transmittance and high conductivity can be manufactured.

According to an embodiment of the present invention, second conductive treatment using pyronin B is performed to separate the phases of a polymer material, thereby inducing connection between grains. As a result, crystallization of the polymer material is affected, and thus a highly conductive polymer thin film having improved conductivity can be manufactured.

BEST MODE

Figure 1A:
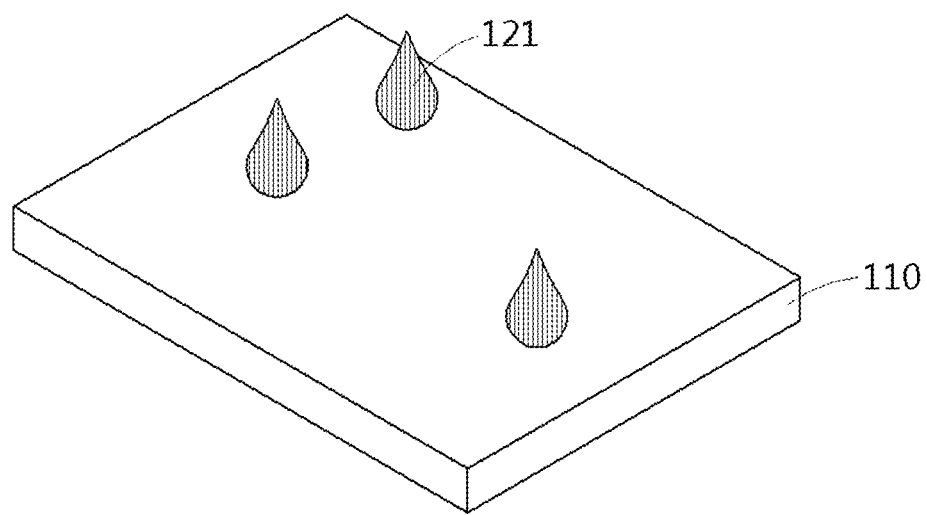
FIGS. 1A to 1H illustrate a method of forming a conductive polymer pattern according to an embodiment of the present invention.

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, a method of manufacturing a highly conductive polymer thin film according to an embodiment of the present invention will be described in detail with reference to FIGS. 1A to 1H.

FIGS. 1A to 1H illustrate the method of manufacturing a highly conductive polymer thin film according to an embodiment of the present invention.

The method of manufacturing a highly conductive polymer thin film according to an embodiment of the present invention includes a step of coating a substrate 110 with a first dopant solution including a polymer material and a first dopant to form a conductive polymer thin film 120 subjected to first conductive treatment 121 and a step of performing second conductive treatment 123 using a second dopant solution including pyronin B on the conductive polymer thin film 120 to form a highly conductive polymer thin film 130.

Conventionally, to increase the electrical conductivity of a polymer thin film (e.g., PEDOT:PSS), post-treatment using sulfuric acid is performed. In this case, a conductive polymer thin film having an electrical conductivity of about 4,000 S/cm may be manufactured. However, the lifespan of a device may be shortened due to damage to the substrate 110 that occurs when performing sulfuric acid treatment and the resulting residues.

However, according to the method of manufacturing a highly conductive polymer thin film according to an embodiment of the present invention, by performing a plurality of conductive treatments, the highly conductive polymer thin film 130 having high electrical conductivity may be manufactured without damage to a substrate and a device.

Accordingly, according to the method of manufacturing a highly conductive polymer thin film according to an embodiment of the present invention, by performing the first conductive treatment 121 using the first dopant and the second conductive treatment 123 using pyronin B, a highly conductive polymer thin film having high transmittance and high conductivity may be manufactured.

In addition, according to the method of manufacturing a highly conductive polymer thin film according to an embodiment of the present invention, when the second conductive treatment 123 using pyronin B is performed, the phases of the polymer material may be separated, and connection between grains may be induced, which affects crystallization of the polymer material. Accordingly, a highly conductive polymer thin film having improved conductivity may be manufactured.

Figure 1B:
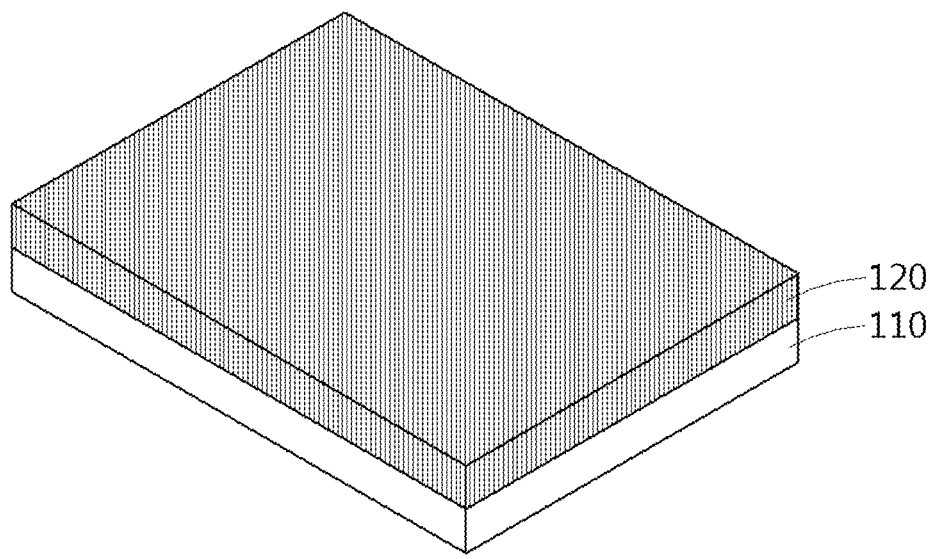

FIGS. 1A and 1B are three-dimensional views showing a process of coating a substrate with a first dopant solution including a polymer material and a first dopant and the substrate on which a conductive polymer thin film subjected to first conductive treatment is formed.

The substrate 110 serves as a support for supporting the conductive polymer thin film 120 formed thereon, and a transparent or translucent flexible substrate may be used as the substrate 110.

The transparent or translucent flexible substrate may be warped or bent, and any materials having good mechanical strength, thermal stability, and transparency may be used as the transparent or translucent flexible substrate without particular limitation.

In addition, a substrate that is not corroded by the first conductive treatment 121 or the second conductive treatment 123 that is subsequently performed may be used as the substrate 110.

The substrate 110 may include at least one of glass, quartz, sapphire, aluminum oxide ($Al_2O_3$), polydimethylsiloxane (PDMS), polyethersulfone (PES), polyethylene naphthalate (PEN), polystyrene, polyethylene terephthalate (PET), polyamide (PI), polyvinyl chloride (PVC), polyvinylpyrrolidone (PVP), polyethylene (PE), polyacrylic acid, polyester (PS), and polyurethane (PU).

According to one embodiment, according to the method of manufacturing a highly conductive polymer thin film according to an embodiment of the present invention, ultraviolet light treatment may be performed on the substrate 110 to modify the surface of the substrate 110 so that the surface has hydrophilicity.

More specifically, ultraviolet light treatment may be performed using an ultraviolet light/ozone processor to modify the surface of the substrate 110 so that the surface has hydrophilicity. As a result of ultraviolet light treatment, residues present on the surface of the substrate 110 may be replaced with —OH, —OOH, —OO—, or the like, thereby reducing a water contact angle.

Accordingly, ultraviolet light treatment may increase the surface adhesion between the surface of the substrate 110 and the conductive polymer thin film 120 to be formed in a subsequent process.

In addition, during ultraviolet light treatment, the concentration of ozone increases over time. Accordingly, 20 to 30 minutes after the ultraviolet light/ozone processor operates, ultraviolet light treatment may be performed on the substrate 110.

The ultraviolet light treatment may be performed for 20 to 30 minutes. When ultraviolet light treatment time is less than 20 minutes, due to insufficient ultraviolet light treatment, the water contact angle of the surface of the substrate 110 may not decrease sufficiently. When ultraviolet light treatment time exceeds 30 minutes, the water contact angle of the surface of the substrate 110 does not decrease further, thereby reducing yield.

Ultraviolet light treatment time is not limited thereto, and may be adjusted depending on the water contact angle of the substrate 110.

Preferably, when ultraviolet light treatment is performed for more than 20 minutes, the water contact angle does not decrease further. Thus, 20-minute treatment may be an optimal condition. However, when many organic foreign substances are present on the surface of the substrate 110, additional time may be required to remove the organic substances using ozone. Accordingly, ultraviolet light and ozone treatment may be performed for 20 to 30 minutes depending on the conditions of the substrate.

In the method of manufacturing a highly conductive polymer thin film according to an embodiment of the present invention, the substrate 110 is coated with the first dopant solution including the polymer material and the first dopant to form the conductive polymer thin film 120 subjected to the first conductive treatment 121.

In the method of manufacturing a highly conductive polymer thin film according to an embodiment of the present invention, by coating the substrate 110 with the first dopant solution including the polymer material and the first dopant, the conductive polymer thin film 120 may be formed, and at the same time, the first conductive treatment 121 may proceed.

The first dopant solution may include the polymer material and the first dopant. According to an embodiment, the first dopant solution may further include a solvent, and the solvent may include at least one of water, methanol, ethanol, propanol, ethylene glycol, N-methylpyrrolidone (NMP), propylene glycol monomethyl ether acetate (PGMEA), acetone, and tetrahydrofuran (THF).

The polymer material may include at least one of polythiophene-based materials, polypyrrole-based materials, polyphenylene-based materials, polyaniline-based materials, and polyacetylene-based materials. Preferably, the polymer material is polyethylene dioxythiophene:polystyrene sulfonate (PEDOT:PSS).

PEDOT:PSS is a conductive plastic material having high conductivity, good transmittance in the visible light region, and high stability. In addition, since PEDOT:PSS is dissolved in water, a solution process may be performed in an environmentally friendly manner.

The first dopant added for doping serves as the charge carrier of the polymer material, and improves the electrical conductivity of the first dopant solution. The first dopant is preferably an organic compound containing oxygen and nitrogen. Preferably, the first dopant is a polar solvent including at least one of dimethyl sulfoxide (DMSO), diethylene glycol monoethyl ether, isophorone, propylene carbonate, cyclohexanone, butyrolactone, hydrochloric acid (HCl), N-methylpyrrolidone (NMP), N,N-dimethylformamide (DMF), and N-dimethylacetamide (DMA). More preferably, the first dopant is dimethyl sulfoxide (DMSO).

For example, in the case of PEDOT/PSS, anionic PSS is present around a PEDOT polymer that exhibits electrical conductivity due to intermolecular attraction. PSS serves to prevent stacking of PEDOT and improve dispersibility for the solvent.

However, PSS having a low electrical conductivity forms a non-conductive molecular chain around PEDOT, so that the overall electrical conductivity of the conductive polymer thin film 120 may be reduced.

According to the method of manufacturing a highly conductive polymer thin film according to an embodiment of the present invention, the first conductive treatment is performed using a mixed solution including the first dopant. In this case, the first dopant surrounds PEDOT, thereby weakening intermolecular force between PEDOT and PSS. Accordingly, the non-conductive molecular chains of PEDOT and PSS are separated, thereby improving the electrical conductivity of the conductive polymer thin film 120.

The volume ratio of the polymer material to the first dopant included in the first dopant solution may be 10:1.

The conductive polymer thin film 120 may be formed using at least one of blade coating, bar coating, spray coating, spin coating, brush coating, dip coating, and gravure coating.

Preferably, the conductive polymer thin film 120 may be formed by spin coating using the first dopant solution. In the spin coating, a certain amount of the first dopant solution is dropped onto the substrate 110, and the substrate 110 is rotated at a high speed. At this time, the substrate 110 is coated with the first dopant solution by centrifugal force applied to the first dopant solution. When the spin coating is used, production cost may be reduced compared to a deposition process. In addition, through process simplification, process cost and process time may be reduced.

More preferably, the conductive polymer thin film 120 having a sheet resistance of 500 to 70 $\Omega$/sq may be formed by performing spin coating at 2,000 rpm for 30 seconds.

To use the conductive polymer thin film 120 as the electrode of a device, the resistance of the conductive polymer thin film 120 must be reduced as much as possible. Accordingly, by changing an rpm condition for coating with the first dopant solution, when coating is performed using the first dopant, the thickness of the conductive polymer thin film 120 may be thin so that charge may be easily transferred. Thus, resistance may be reduced.

According to the method of manufacturing a highly conductive polymer thin film according to an embodiment of the present invention, when the conductive polymer thin film 120 is formed, an rpm condition for forming the conductive polymer thin film 120 may be controlled to adjust the thickness of the thin film. Thereby, the resistance of the conductive polymer thin film 120 formed by the first conductive treatment may be reduced, and the resistance of the highly conductive polymer thin film may be also reduced.

In addition, as an rpm value increases, a resistance value decreases, indicating good resistance characteristics. When the thin film of the conductive polymer thin film 120 is too thin, the conductive polymer thin film 120 may peel off during the second conductive treatment. Accordingly, in the method of manufacturing a highly conductive polymer thin film according to an embodiment of the present invention, an rpm condition is preferably 2,000 rpm to 2,500 rpm.

In addition, according to the method of manufacturing a highly conductive polymer thin film according to an embodiment of the present invention, since the substrate 110 is coated with the first dopant solution including the polymer material and the first dopant, the electrical properties of the conductive polymer thin film 120 may be excellent. In addition, since the electrical properties vary greatly depending on surface conditions, the conductive polymer thin film 120 is preferably used as a transparent electrode material.

Figure 1C:
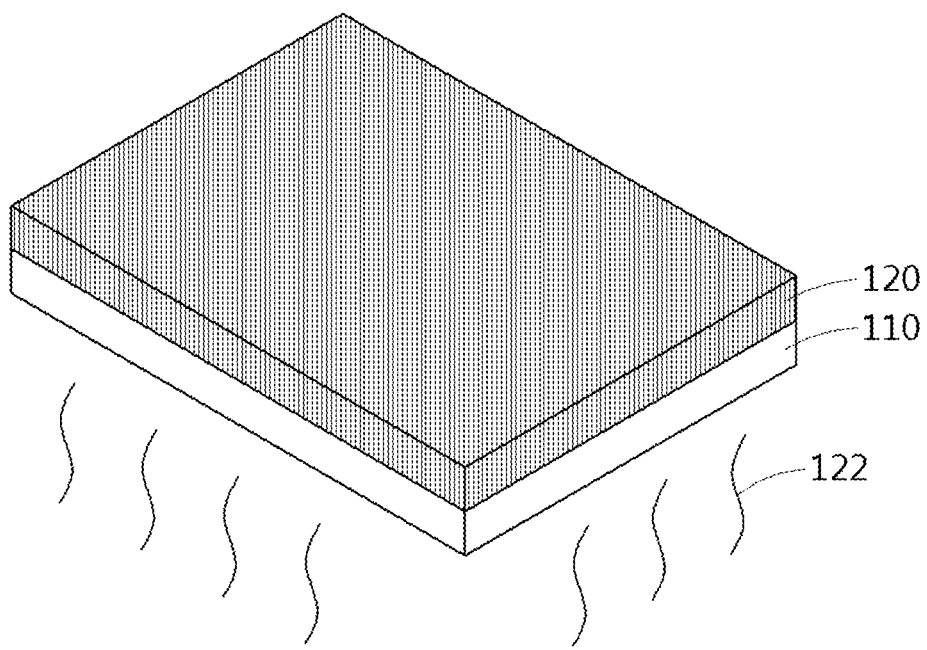

FIG. 1C is a three-dimensional view showing a process of performing first heat treatment on a conductive polymer thin film.

According to one embodiment, in the method of manufacturing a highly conductive polymer thin film according to an embodiment of the present invention, first heat treatment 122 may be performed at a temperature of 120° C. to 150° C. on the conductive polymer thin film 120 that has been subjected to the first conductive treatment 121.

The first heat treatment 122 may dry the conductive polymer thin film 120 formed on the substrate 110, and at the same time, may increase adhesion between the substrate 110 and the conductive polymer thin film 120.

The first heat treatment 122 may be performed at 120° C. to 150° C. When the first heat treatment 122 is performed at a temperature less than 120° C., a solvent (e.g., water) is not completely removed, and a polymer layer 151 is not completely dried. When the first heat treatment 122 is performed at a temperature exceeding 150° C., the conductive polymer thin film 120 may be deformed.

Figure 1D:
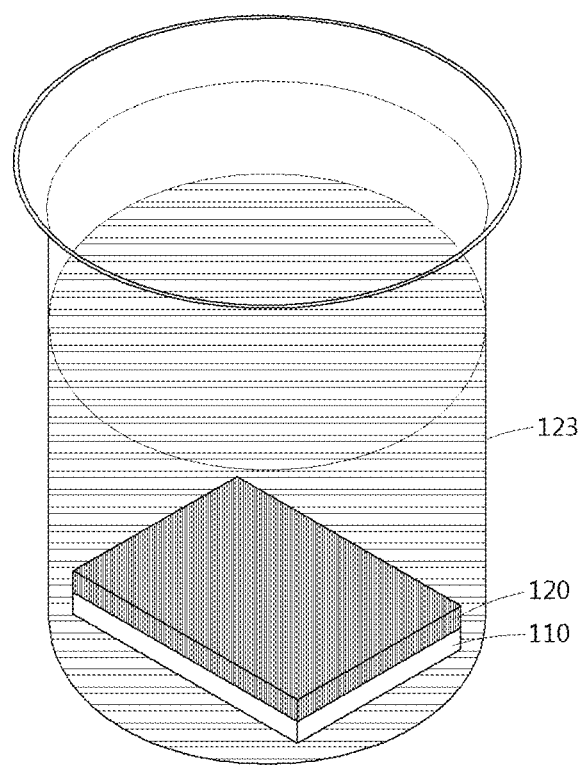
Figure 1E:
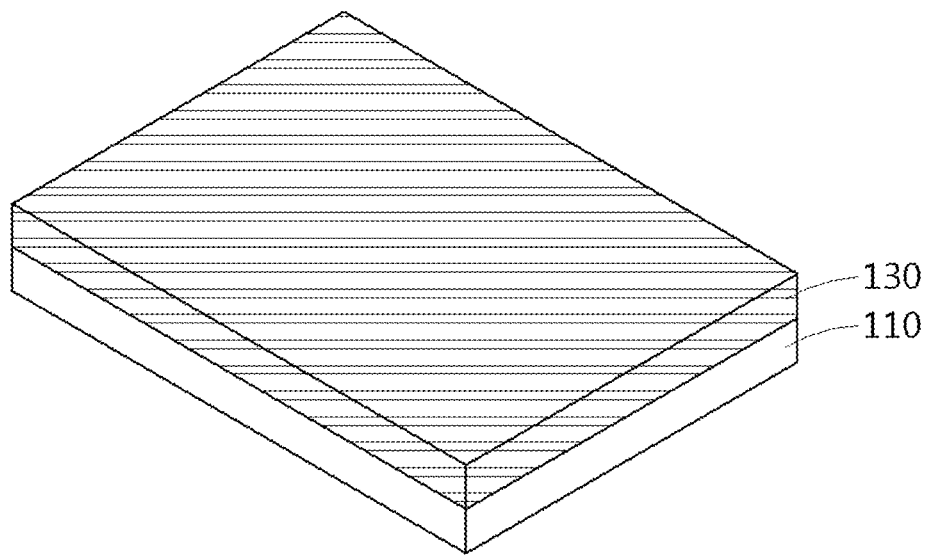

FIGS. 1D and 1E are three-dimensional views showing a process of performing second conductive treatment using a second dopant solution including pyronin B on a conductive polymer thin film and a substrate on which a highly conductive polymer thin film subjected to the second conductive treatment is formed.

In the method of manufacturing a highly conductive polymer thin film according to an embodiment of the present invention, the second conductive treatment 123 using the second dopant solution including pyronin B is performed on the conductive polymer thin film 120 to form the highly conductive polymer thin film 130.

The second dopant solution may include pyronin B. According to an embodiment, the second dopant solution may further include a solvent, and the solvent may include at least one of water, methanol, ethanol, propanol, ethylene glycol, N-methylpyrrolidone (NMP), propylene glycol monomethyl ether acetate (PGMEA), acetone, and tetrahydrofuran (THF).

For example, in the case of PEDOT/PSS, anionic PSS is present around a PEDOT polymer that exhibits electrical conductivity due to intermolecular attraction. PSS serves to prevent stacking of PEDOT and improve dispersibility for the solvent.

However, PSS having a low electrical conductivity forms a non-conductive molecular chain around PEDOT, so that the overall electrical conductivity of the conductive polymer thin film 120 may be reduced.

However, according to the method of manufacturing a highly conductive polymer thin film according to an embodiment of the present invention, the second conductive treatment is performed using the second dopant solution including pyronin B. In this case, pyronin B surrounds PEDOT, thereby weakening the intermolecular force between PEDOT and PSS and inducing a "charge separated transition state".

Accordingly, the non-conductive molecular chains of PEDOT and PSS are separated, and pyronin B separates the phases of the polymer material to induce connection between grains, thereby improving the electrical conductivity of the highly conductive polymer thin film 130.

More specifically, according to the method of manufacturing a highly conductive polymer thin film according to an embodiment of the present invention, when the second conductive treatment is performed using the second dopant solution including pyronin B, PEDOT is agglomerated by pyronin B, the grain size of PEDOT is increased, and the grain size of PSS, which is an insulator, is relatively decreased, thereby improving the electrical conductivity of PEDOT:PSS.

In addition, when the second conductive treatment is performed using the second dopant solution including pyronin B, pyronin B stabilizes the separated state of positively charged PEDOT and negatively charged PSS. Thus, due to the strong $\pi$-$\pi$ lamination adhesion of PEDOT and the rigidity of a backbone, a dense PEDOT network is created, and amorphous PEDOT:PSS granules are formed in a crystalline nanofibril structure. Due to significant changes in a crystal structure and a morphological structure, structural realignment from amorphous PEDOT:PSS into crystalline PEDOT:PSS nanofibril occurs. As a result, the conductivity and transparency of PEDOT:PSS may be improved.

In addition, PEDOT is a conductive material, but PSS is a non-conductive material. Accordingly, conductivity may be improved by including only minimum PSS necessary to maintain the structure of PEDOT:PSS.

In addition, according to the method of manufacturing a highly conductive polymer thin film according to an embodiment of the present invention, by performing the second conductive treatment 123 using the second dopant solution including pyronin B, an RMS value may increase, thereby improving surface roughness (e.g., formation of an uneven surface).

In particular, according to the method of manufacturing a highly conductive polymer thin film according to an embodiment of the present invention, by performing the second conductive treatment 123 using the second dopant solution including pyronin B on the highly conductive polymer thin film 130, compared to the conductive polymer thin film 120 that has been subjected only to the first conductive treatment 121, sheet resistance may be reduced by about 35%, and there is little difference in transmittance.

In addition, according to the method of manufacturing a highly conductive polymer thin film according to an embodiment of the present invention, by performing the second conductive treatment 123 using the second dopant solution including pyronin B on the highly conductive polymer thin film 130, the work function of the highly conductive polymer thin film 130 may be increased, and thus the highly conductive polymer thin film 130 may be used as an electrode in various devices.

In addition, according to the method of manufacturing a highly conductive polymer thin film according to an embodiment of the present invention, by performing the second conductive treatment 123 using the second dopant solution including pyronin B on the highly conductive polymer thin film 130, a work function may be controlled, which makes hole injection smooth. Thus, the highly conductive polymer thin film 130 may be used as a hole transport layer.

The sheet resistance of the highly conductive polymer thin film 130 may be controlled by adjusting the concentration of pyronin B.

The concentration of pyronin B may be 0.0001 wt % to 0.1 wt %. When the concentration of pyronin B is less than 0.0001 wt %, the effect of improving electrical conductivity may be negligible. When the concentration of pyronin B exceeds 0.1 wt %, since there is no effect of improving electrical conductivity by adding pyronin B, pyronin B may be wasted.

Accordingly, the highly conductive polymer thin film 130 manufactured by the method of manufacturing a highly conductive polymer thin film according to an embodiment of the present invention may have a sheet resistance value of 200Ω/□ or less.

In addition, an electron injection barrier in an electronic device corresponds to a value obtained by subtracting the work function of graphene from the ionization energy of a semiconductor according to the Schottky barrier theory. When graphene is used as a transparent electrode in an electronic device such as a light-emitting diode (LED) and an organic light-emitting diode (OLED), low luminous efficiency is exhibited.

However, according to the method of manufacturing a highly conductive polymer thin film according to an embodiment of the present invention, by performing the first conductive treatment 121 and the second conductive treatment 123, the work function of the highly conductive polymer thin film 130 may be increased, and thus the highly conductive polymer thin film 130 may have a work function of 4.6 eV to 5.1 eV. Compared to graphene or general polymer thin films (e.g., PEDOT:PSS), the highly conductive polymer thin film 130 has a high work function value. Accordingly, the highly conductive polymer thin film 130 may be used in an electronic device within a work function range of 4.6 eV to 5.1 eV.

The electronic device may be an organic light-emitting diode (OLED), a light-emitting diode (LED), a liquid crystal display device, an electronic paper, a plasma display panel, or a solar cell device.

In addition, the second dopant solution may further include the first dopant. Accordingly, the highly conductive polymer thin film 130 manufactured by the method of manufacturing a highly conductive polymer thin film according to an embodiment of the present invention may maximize the effect of improving electrical conductivity.

In the method of manufacturing a highly conductive polymer thin film according to an embodiment of the present invention, the step of forming the highly conductive polymer thin film 130 may be performed by a dipping method or a spraying method.

According to the method of manufacturing a highly conductive polymer thin film according to an embodiment of the present invention, the dipping method of dipping the conductive polymer thin film 120 in the second dopant solution for a certain time and the spraying method of applying the second dopant solution to the conductive polymer thin film 120 using a spray apparatus are advantageous in that the methods are simple and require no separate apparatus.

Figure 1F:
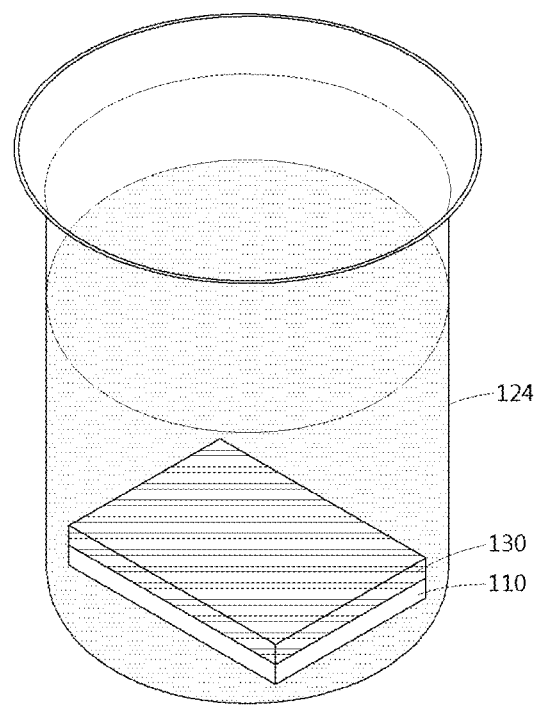

FIG. 1F is a three-dimensional view showing a process of performing rinse treatment on a substrate on which a highly conductive polymer thin film has been formed.

According to one embodiment, in the method of manufacturing a highly conductive polymer thin film according to an embodiment of the present invention, rinse treatment 124 may be performed on the substrate on which the highly conductive polymer thin film has been formed.

Since an excess of ions or molecules detached from the highly conductive polymer thin film 130 by the second conductive treatment 123 may be attached on the surface of the highly conductive polymer thin film 130, rinse treatment is preferably performed using a sufficient amount of a cleaning agent.

Known cleaning agents may be used as the cleaning agent of the present invention without limitation. Preferably, the cleaning agent is water, more preferably deionized water.

Figure 1G:
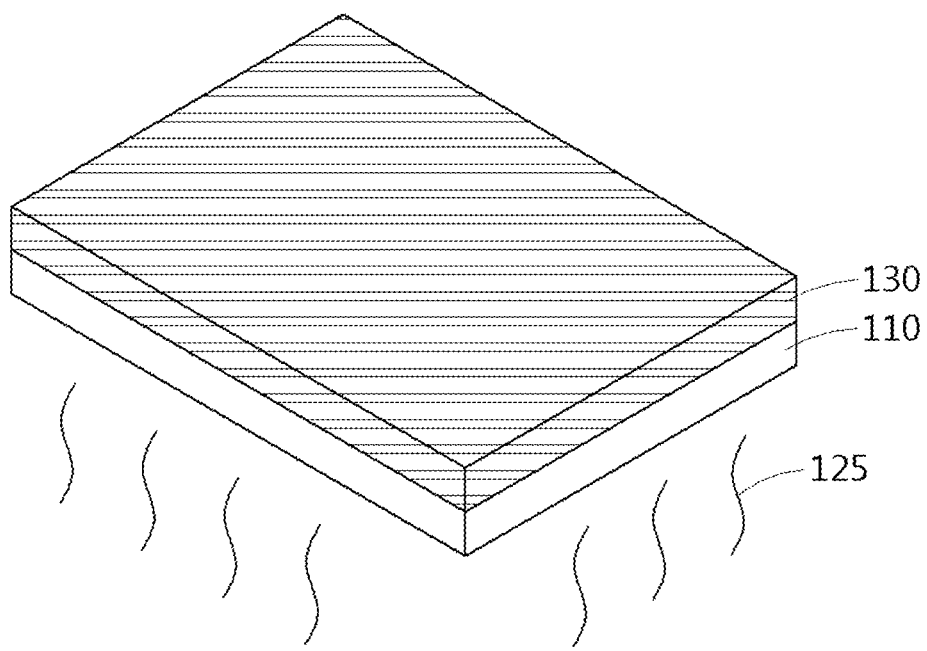

FIG. 1G is a three-dimensional view showing a process of performing second heat treatment on a highly conductive polymer thin film.

In the method of manufacturing a highly conductive polymer thin film according to an embodiment of the present invention, second heat treatment 125 in which the highly conductive polymer thin film 130, which is a conductive polymer thin film, that has been subjected to the second conductive treatment 123 is heat-treated at a temperature of 120° C. to 150° C. may be performed.

Through the second heat treatment 125, the highly conductive polymer thin film 130 formed on the substrate 110 may be dried.

In addition, in the method of manufacturing a highly conductive polymer thin film according to an embodiment of the present invention, after performing the second conductive treatment 123, the rinse treatment 124 is performed to remove residual materials. In this case, to completely remove a solvent (e.g., water) used in the rinse treatment 124, the second heat treatment 125 may be performed.

The second heat treatment 125 may be performed at 120° C. to 150° C. When the second heat treatment 125 is performed at a temperature of less than 120° C., the highly conductive polymer thin film 130 may not be completely dried. When the second heat treatment 125 is performed at a temperature exceeding 150° C., the highly conductive polymer thin film 130 may be deformed.

According to one embodiment, according to the method of manufacturing a highly conductive polymer thin film according to an embodiment of the present invention, by performing acid treatment using at least one of hydrochloric acid, sulfuric acid, and acetic acid, the electrical conductivity of the highly conductive polymer thin film 130 may be further improved.

Figure 1H:
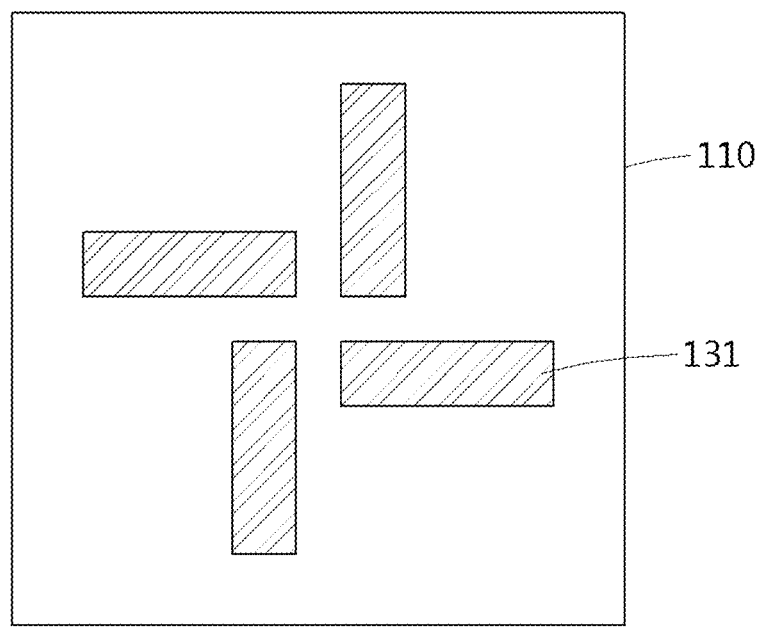

FIG. 1H is a three-dimensional view of a highly conductive polymer thin film according to an embodiment of the present invention.

According to one embodiment, according to the method of manufacturing a highly conductive polymer thin film according to an embodiment of the present invention, by performing patterning of the highly conductive polymer thin film 130 formed on the substrate 110, transparent electrodes 131, which are the pattern of a conductive polymer thin film, may be formed.

According to the method of manufacturing a highly conductive polymer thin film according to an embodiment of the present invention, by performing the first conductive treatment 121 using the first dopant and the second conductive treatment 123 using pyronin B, the work function of a polymer thin film may be controlled. Thereby, a high-efficiency high-conductivity polymer thin film may be manufactured.

Accordingly, the transparent electrodes 131 formed by the method of manufacturing a highly conductive polymer thin film according to an embodiment of the present invention may have a sheet resistance value of 200Ω/☐ or less.

The transparent electrodes 131 may be patterned by a photolithography or imprinting process.

According to the imprinting process, after the highly conductive polymer thin film 130 is formed on the substrate 110, the substrate 110 is pressed using a mold including a pattern with a predetermined force to form the transparent electrodes 131, which are the pattern of a conductive polymer thin film. Advantageously, the transparent electrodes 131 may be easily formed on the large area substrate 110.

According to the photolithography process, the highly conductive polymer thin film 130 formed on the substrate 110 is exposed to light and etched using a mask including a pattern to form the transparent electrodes 131, which is the pattern of a conductive polymer thin film. Advantageously, the precision of the pattern may be further improved.

The shape of the transparent electrode 131 is not particularly limited, and the transparent electrode 131 may be formed in various shapes. Preferably, the shape of the transparent electrode 131 includes at least one of stripe, grid, cylinder, cone, and polygon shapes.

In addition, when the highly conductive polymer thin film 130 manufactured by the method of manufacturing a highly conductive polymer thin film according to an embodiment of the present invention is used as an electrode, the highly conductive polymer thin film 130 may be mixed with at least one of Ag nanowire, SCNT, MCNT, DCNT, graphene, BN, $MoS_2$, $MoSe_2$, $MoTE_2$, $WTE_2$, and graphene.

The highly conductive polymer thin film 130 manufactured by the method of manufacturing a highly conductive polymer thin film according to an embodiment of the present invention may be applied to flexible or wearable displays that have been spotlighted as next-generation displays. More specifically, the highly conductive polymer thin film according to an embodiment of the present invention may be used in at least one of an organic light-emitting diode (OLED), a light-emitting diode (LED), a solar cell, a touch panel screen, a battery, a sensor, a transistor, a piezoelectric element, a memory, a memristor, and a synapse element.

In particular, using the highly conductive polymer thin film 130 manufactured by the method of manufacturing a highly conductive polymer thin film according to an embodiment of the present invention, a high conductivity organic thin film using liquid surface treatment and a high-efficiency organic solar cell using the same may be manufactured.

In addition, the highly conductive polymer thin film 130 manufactured by the method of manufacturing a highly conductive polymer thin film according to an embodiment of the present invention may be used as a high-conductivity flexible transparent electrode having improved electrical conductivity, and at the same time, may be used as a hole injection layer and a hole extraction layer for an organic layer.

In addition, according to the method of manufacturing a highly conductive polymer thin film according to an embodiment of the present invention, the morphology of the highly conductive polymer thin film 130 may be improved by adding a water-soluble polymer surfactant to the first dopant solution or the second dopant solution. Thus, the highly conductive polymer thin film 130 may be used in high-efficiency organic solar cells.

The surfactant may be included to improve the spreadability of the first dopant solution or the second dopant solution, and the content of the surfactant is preferably 0.01 to 5 wt % based on a total weight of the first dopant solution or the second dopant solution. When the content of the surfactant is less than 0.01 wt %, the desired level of spreadability may not be obtained. When the content of the surfactant exceeds 5 wt %, the electrical conductivity of the highly conductive polymer thin film 130 may be reduced.

A fluorine-based surfactant, which is a nonionic surfactant, is preferably used as the surfactant.

Preferably, the conductive polymer thin film 130 manufactured by the method of manufacturing a highly conductive polymer thin film according to an embodiment of the present invention may be used as a transparent electrode or a hole transport layer in a flexible organic light-emitting diode (OLED).

In the organic light-emitting diode (OLED), a first electrode, an organic layer, and a second electrode may be sequentially formed on a substrate, and the organic layer may include at least one of a hole transport layer, a light-emitting layer, and an electron transport layer.

In addition, the highly conductive polymer thin film 130 manufactured by the method of manufacturing a highly conductive polymer thin film according to an embodiment of the present invention may be used as at least one of the first electrode, the second electrode, and the hole transport layer of the organic light-emitting diode (OLED).

The first electrode may be a positive electrode or a negative electrode. As the first electrode, the highly conductive polymer thin film 130 manufactured by the method of manufacturing a highly conductive polymer thin film according to an embodiment of the present invention may be used. The first electrode may include at least one of indium tin oxide (ITO), indium zinc oxide (IZO), tin oxide (TO), zinc oxide (ZnO), carbon nanotube thin films, graphene, graphene oxides, metal-coupled carbon nanotubes, calcium, lithium, aluminum, alloys of lithium fluoride (LiF) and lithium, alkali metal salts, and conductive polymers.

The first electrode may be formed using at least one method of sputtering, E-beam processing, spin coating, bar coating, spray coating, screen printing, inkjet printing, doctor blading, and gravure printing.

The hole transport layer serves to facilitate injection and transport of holes into a light-emitting layer. As the hole transport layer, the highly conductive polymer thin film 130 manufactured by the method of manufacturing a highly conductive polymer thin film according to an embodiment of the present invention may be used. The hole transport layer may include at least one of poly(3,4-ethylenedioxythiophene)-polystyrene sulfonate (PEDOT-PSS), polyaniline, copper phthalocyanine (CuPC), poly-thiophenylenevinylene, polyvinylcarbazole, poly-p-phenylenevinylene, and mixtures thereof.

The hole transport layer may be formed using at least one method of sputtering, E-beam processing, spin coating, bar coating, spray coating, screen printing, inkjet printing, doctor blading, and gravure printing.

The light-emitting layer corresponds to a light-emitting region where electrons transported from the negative electrode and holes transported from the positive electrode meet to form excitons.

The light-emitting layer may be formed using at least one method of vacuum deposition, spin coating, inkjet printing, and laser-induced thermal transfer printing on the hole transport layer.

The light-emitting layer may be an organic light-emitting layer of a phosphorescent light-emitting layer or a fluorescent light-emitting layer. When the light-emitting layer is a fluorescent light-emitting layer, the light-emitting layer may include at least one of 8-trishydroxyquinoline aluminum (Alq3), distyrylarylene (DSA), distyrylarylene derivatives, distyrylbenzene (DSB), distyrylbenzene derivatives, 4,4'-bis (2,2'-diphenyl vinyl)-1,1'-biphenyl (DPVBi), DPVBi derivatives, spiro-DPVBi, and spirosexyphenyl. In addition, the light-emitting layer may include at least one of styrylamine-based, pherylene-based, and distyrylbiphenyl (DSBP)-based dopants.

When the light-emitting layer is a phosphorescent light-emitting layer, the light-emitting layer may include at least one of arylamine-based, carbazole-based, and spiro-based materials as a host material. Preferably, the host material includes at least one of 4,4-N,N dicarbazole-biphenyl (CBP), CBP derivatives, N,N-dicarbazolyl-3,5-benzene (mCP), mCP derivatives, and spiro-based derivatives.

The dopant material may include a phosphorescent organometallic complex having one central metal selected from the group consisting of Ir, Pt, Tb, and Eu. Preferably, the phosphorescent organometallic complex includes at least one of PQIr, PQIr(acac), PQ2Ir(acac), PIQIr(acac), and PtOEP.

In addition, the light-emitting layer may include at least one of poly-p-phenylene (PPP)-based, poly-fluorene (PF)-based, poly-p-phenylenevinylene (PPV)-based, and poly-thiophene (PT)-based polymers.

The electron transport layer serves to facilitate injection and transport of electrons into the light-emitting layer, and may be formed using at least one electron transport material of lithium fluoride (LiF), calcium, lithium, and titanium oxide.

The second electrode may be a positive electrode or a negative electrode. As the second electrode, the highly conductive polymer thin film 130 manufactured by the method of manufacturing a highly conductive polymer thin film according to an embodiment of the present invention may be used. The second electrode may include at least one of indium tin oxide (ITO), indium zinc oxide (IZO), tin oxide (TO), zinc oxide (ZnO), carbon nanotube thin films, graphene, graphene oxides, metal-coupled carbon nanotubes, calcium, lithium, aluminum, alloys of lithium fluoride (LiF) and lithium, alkali metal salts, and conductive polymers.

The second electrode may be formed using at least one method of sputtering, E-beam processing, spin coating, bar coating, spray coating, screen printing, inkjet printing, doctor blading, and gravure printing on the electron transport layer.

Accordingly, by using the transparent electrode manufactured by the method of manufacturing a highly conductive polymer thin film according to an embodiment of the present invention as at least one of the first electrode, the second electrode, and the hole transport layer, patterning or formation of an electrode having high transmittance and high conductivity may be performed through a simple solution process. Accordingly, the process difficulty and process cost of a flexible organic light-emitting diode (OLED) may be reduced.

Hereinafter, the properties of the highly conductive polymer thin film manufactured by the method of manufacturing a highly conductive polymer thin film according to an embodiment of the present invention will be described with reference to FIGS. 2A and 6.

Manufacturing Example

A substrate was coated, using spin coating, with a first dopant solution prepared by mixing a PEDOT:PSS polymer solution and a DMSO solvent in a ratio of 10:1 to deposit a conductive PEDOT:PSS polymer thin film on the substrate, and then first heat treatment was performed at 130° C. for 15 minutes. Thereafter, second conductive treatment was performed by dipping the conductive polymer thin film that had been subjected to the first heat treatment in a second dopant solution prepared by dissolving pyronin B in DMSO, the conductive polymer thin film was washed with DMSO, and then second heat treatment was performed at 130° C. for 15 minutes to manufacture a highly conductive PEDOT:PSS polymer thin film. Finally, patterning of the highly conductive PEDOT:PSS polymer thin film was performed to manufacture transparent electrodes.

Figure 2A:
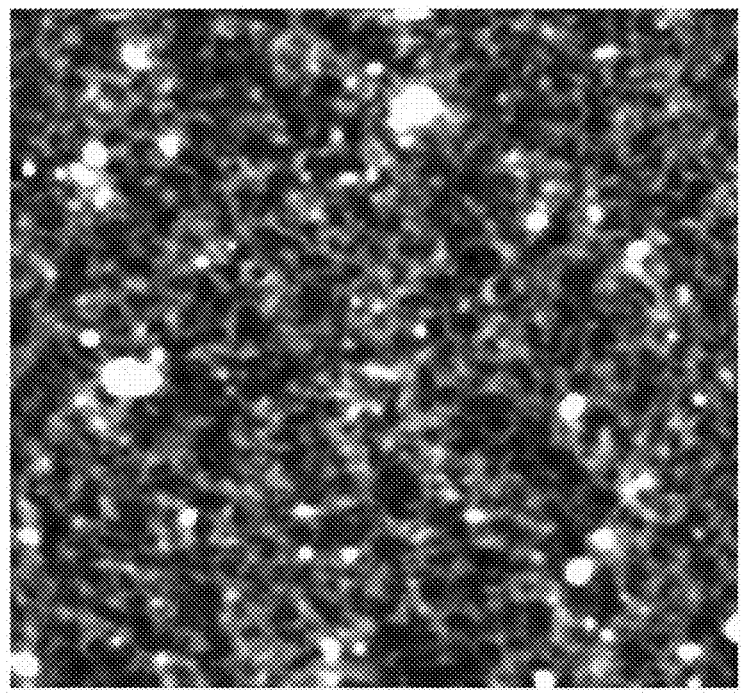
FIG. 2A is an image obtained through atomic force microscope (AFM) analysis performed to observe the root mean square (RMS) surface roughness of a PEDOT:PSS polymer thin film that has not been subjected to conductive treatment.
Figure 2B:
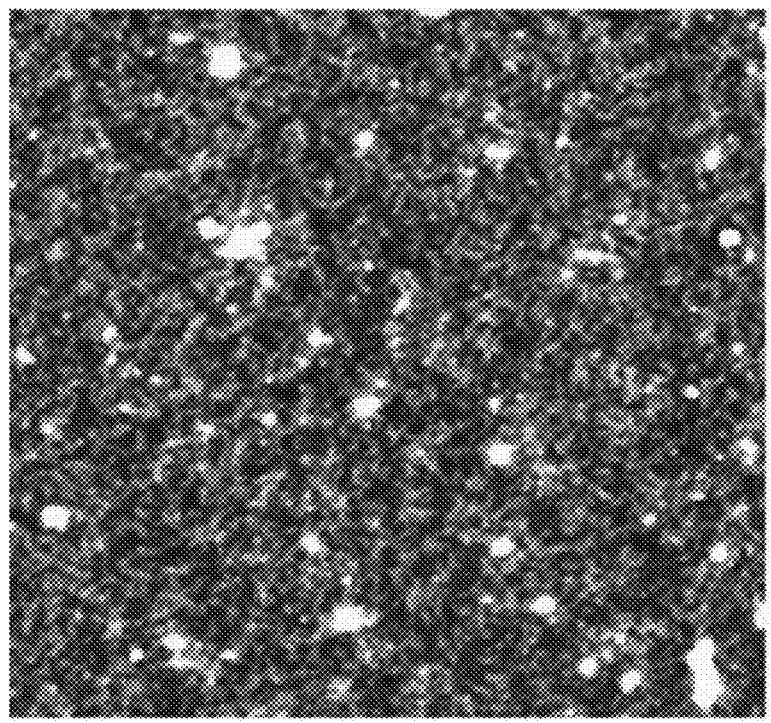
FIG. 2B is an image obtained through AFM analysis performed to observe the RMS surface roughness of a conductive PEDOT:PSS polymer thin film that has been subjected only to first conductive treatment.

FIG. 2A is an image obtained through atomic force microscope (AFM) analysis performed to observe the root mean square (RMS) surface roughness of a PEDOT:PSS polymer thin film that has not been subjected to conductive treatment; FIG. 2B is an image obtained through AFM analysis performed to observe the RMS surface roughness of a conductive PEDOT:PSS polymer thin film that has been subjected only to first conductive treatment; and FIG. 2C is an image obtained through AFM analysis performed to observe the RMS surface roughness of a highly conductive PEDOT:PSS polymer thin film manufactured by a method of manufacturing a highly conductive polymer thin film according to an embodiment of the present invention.

Figure 2C:
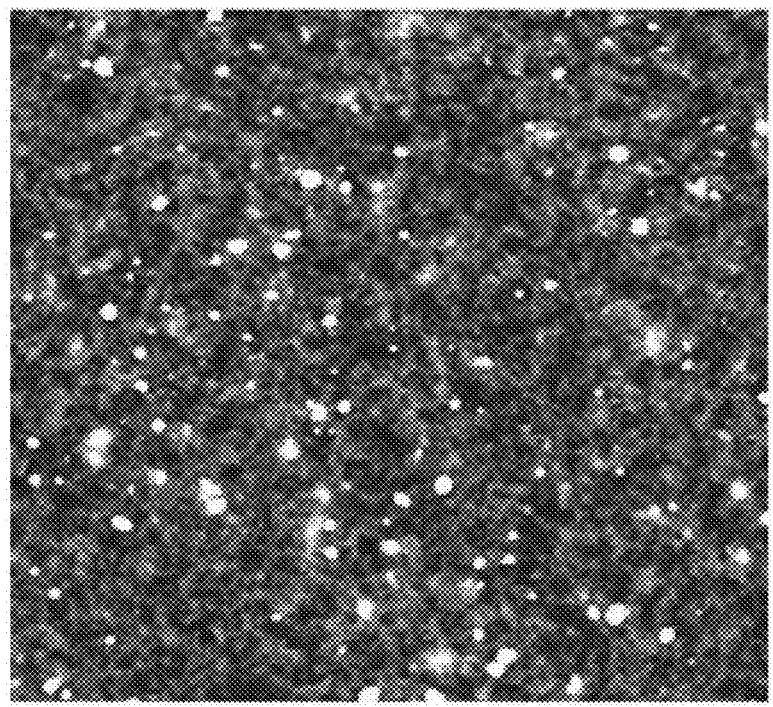
FIG. 2C is an image obtained through AFM analysis performed to observe the RMS surface roughness of a highly conductive PEDOT:PSS polymer thin film manufactured by a method of manufacturing a highly conductive polymer thin film according to an embodiment of the present invention.

Referring to FIGS. 2A to 2C, it can be confirmed that, when the first conductive treatment and the second conductive treatment are performed on PEDOT:PSS, RMS surface roughness changes.

In addition, in the case of the PEDOT:PSS polymer thin film that has not been subjected to conductive treatment, conductivity PEDOT particles are not clearly formed and contact of the particles is broken. On the other hand, in the case of the highly conductive PEDOT:PSS polymer thin film manufactured by the method of manufacturing a highly conductive polymer thin film according to an embodiment of the present invention, contact of PEDOT is maintained by the second conductive treatment using pyronin B.

Figure 3A:
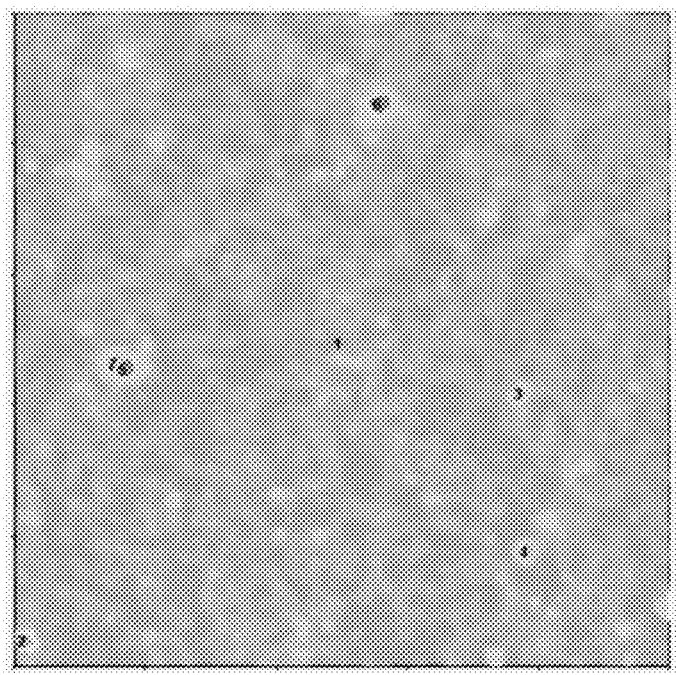
FIG. 3A is an image obtained through field emission scanning electron microscope (FE-SEM) analysis performed to observe the grain size of a PEDOT:PSS polymer thin film that has not been subjected to conductive treatment.
Figure 3B:
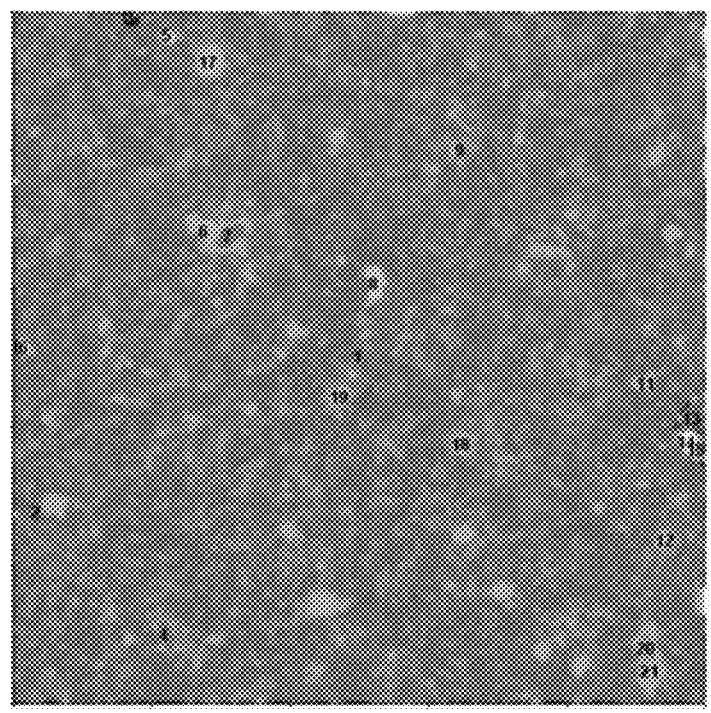
FIG. 3B is an image obtained through FE-SEM analysis performed to observe the grain size of a conductive PEDOT:PSS polymer thin film that has been subjected only to first conductive treatment.

FIG. 3A is an image obtained through field emission scanning electron microscope (FE-SEM) analysis performed to observe the grain size of a PEDOT:PSS polymer thin film that has not been subjected to conductive treatment; FIG. 3B is an image obtained through FE-SEM analysis performed to observe the grain size of a conductive PEDOT:PSS polymer thin film that has been subjected only to first conductive treatment; and FIG. 3C is an image obtained through FE-SEM analysis performed to observe the grain size of a highly conductive PEDOT:PSS polymer thin film manufactured by a method of manufacturing a highly conductive polymer thin film according to an embodiment of the present invention.

Figure 3C:
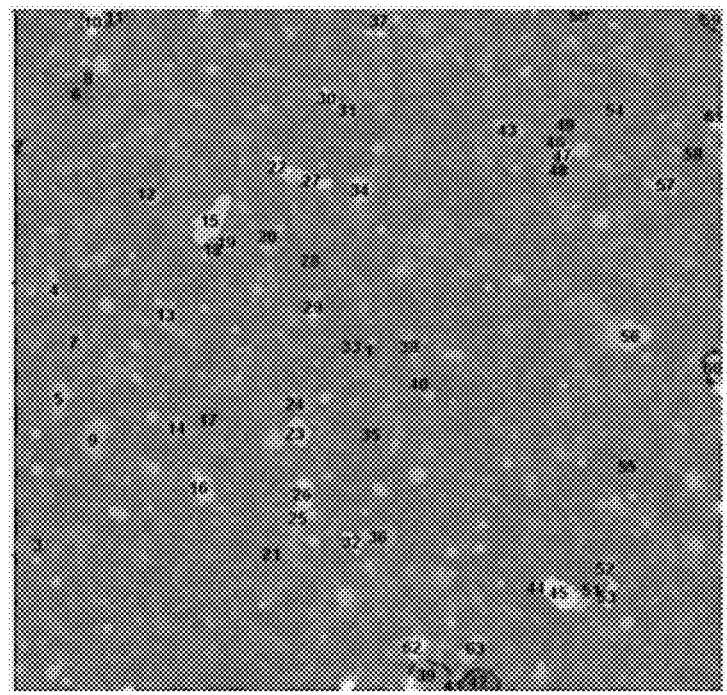
FIG. 3C is an image obtained through FE-SEM analysis performed to observe the grain size of a highly conductive PEDOT:PSS polymer thin film manufactured by a method of manufacturing a highly conductive polymer thin film according to an embodiment of the present invention.

Referring to FIGS. 3A to 3C, it can be confirmed that, in the method of manufacturing a highly conductive polymer thin film according to an embodiment of the present invention, by performing the first conductive treatment and the second conductive treatment on PEDOT:PSS, the grains of PEDOT are aggregated and lengthened compared to the PEDOT:PSS polymer thin film that has not been subjected to conductive treatment.

In addition, it can be confirmed that, in the highly conductive PEDOT:PSS polymer thin film manufactured by the method of manufacturing a highly conductive polymer thin film according to an embodiment of the present invention, phase separation of PEODT and PSS occurs, thereby improving connection between PEDOT grains and electrical conductivity.

Figure 4:
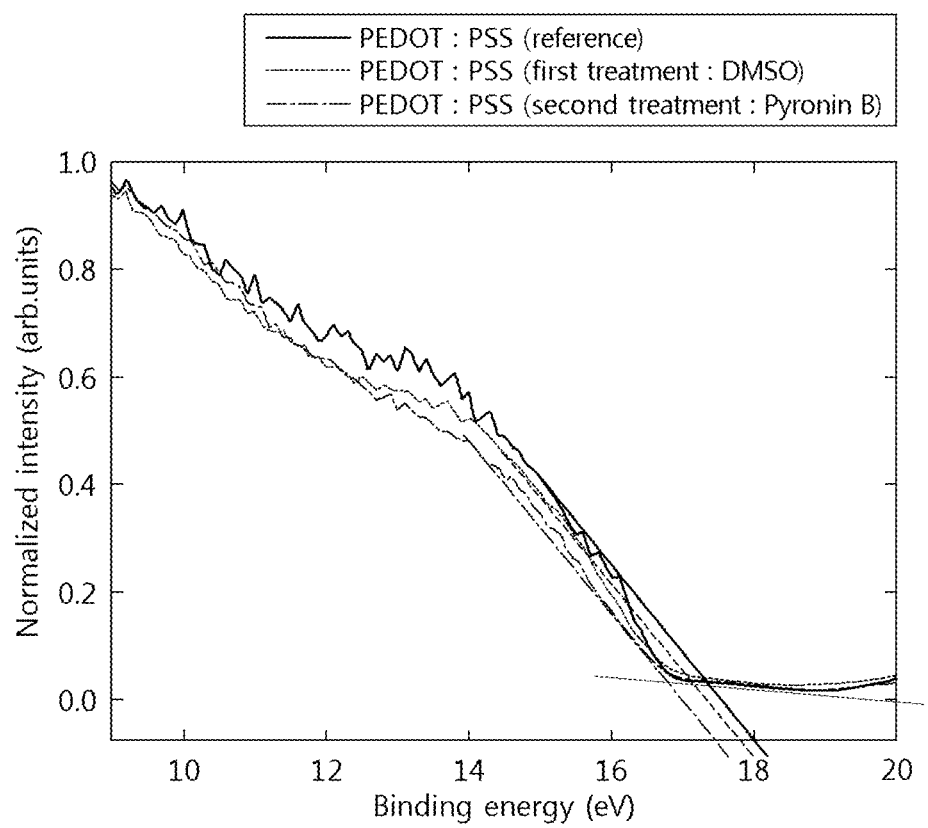
FIG. 4 is a graph showing changes in the work functions of a PEDOT:PSS polymer thin film (reference) that has not been subjected to conductive treatment, a conductive PEDOT:PSS polymer thin film (first treatment: DMSO) that has been subjected only to first conductive treatment, and a highly conductive PEDOT:PSS polymer thin film (second treatment: pyronin B) manufactured by a method of manufacturing a highly conductive polymer thin film according to an embodiment of the present invention.

FIG. 4 is a graph showing changes in the work functions of a PEDOT:PSS polymer thin film (reference) that has not been subjected to conductive treatment, a conductive PEDOT:PSS polymer thin film (first treatment: DMSO) that has been subjected only to first conductive treatment, and a highly conductive PEDOT:PSS polymer thin film (second treatment: pyronin B) manufactured by a method of manufacturing a highly conductive polymer thin film according to an embodiment of the present invention Referring to FIG. 4, it can be confirmed that, in the order of the PEDOT:PSS polymer thin film (reference) that has not been subjected to conductive treatment; the conductive PEDOT:PSS polymer thin film (first treatment: DMSO) that has been subjected only to the first conductive treatment; and the highly conductive PEDOT:PSS polymer thin film (second treatment: pyronin B) manufactured by the method of manufacturing a highly conductive polymer thin film according to an embodiment of the present invention, work function thereof gradually increases.

Accordingly, according to the method of manufacturing a highly conductive polymer thin film according to an embodiment of the present invention, the second conductive treatment is performed to control work function, which makes hole injection smooth. Thus, the highly conductive PEDOT:PSS polymer thin film may serve as an electrode.

More specifically, the cutoff energy value of the PEDOT:PSS polymer thin film (reference) that has not been subjected to conductive treatment was 17.2 eV, the cutoff energy value of the conductive PEDOT:PSS polymer thin film (first treatment: DMSO) that has been subjected only to the first conductive treatment was 16.8 eV, and the cutoff energy value of the highly conductive PEDOT:PSS polymer thin film (second treatment: pyronin B) manufactured by the method of manufacturing a highly conductive polymer thin film according to an embodiment of the present invention was 16.5 eV. Work functions thereof calculated with the cutoff energy values were 4 eV, 4.3 eV, and 4.7 eV, respectively.

In general, considering that the work function of an ITO electrode used as a positive electrode is 4.7 eV, it can be seen that the work function of the highly conductive PEDOT:PSS polymer thin film (second treatment: pyronin B) manufactured by the method of manufacturing a highly conductive polymer thin film according to an embodiment of the present invention is similar to that of the ITO electrode.

Figure 5:
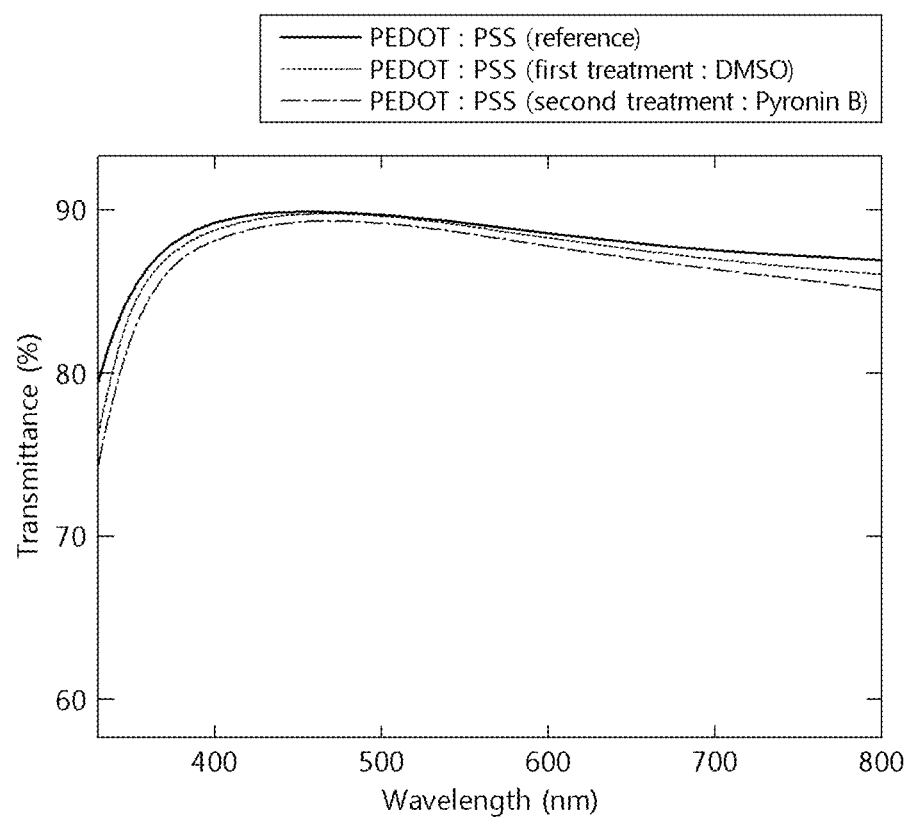
FIG. 5 is a graph showing changes in the transmittances of a PEDOT:PSS polymer thin film (reference) that has not been subjected to conductive treatment, a conductive PEDOT:PSS polymer thin film (first treatment: DMSO) that has been subjected only to first conductive treatment, and a highly conductive PEDOT:PSS polymer thin film (second treatment: pyronin B) manufactured by a method of manufacturing a highly conductive polymer thin film according to an embodiment of the present invention.

FIG. 5 is a graph showing changes in the transmittances of a PEDOT:PSS polymer thin film (reference) that has not been subjected to conductive treatment, a conductive PEDOT:PSS polymer thin film (first treatment: DMSO) that has been subjected only to first conductive treatment, and a highly conductive PEDOT:PSS polymer thin film (second treatment: pyronin B) manufactured by a method of manufacturing a highly conductive polymer thin film according to an embodiment of the present invention.

To use a highly conductive polymer thin film as a transparent electrode, transmittance in the visible light region is a very important factor.

Referring to FIG. 5, all of the PEDOT:PSS polymer thin film (reference) that has not been subjected to conductive treatment, the conductive PEDOT:PSS polymer thin film (first treatment: DMSO) that has been subjected only to the first conductive treatment, and the highly conductive PEDOT:PSS polymer thin film (second treatment: pyronin B) manufactured by the method of manufacturing a highly conductive polymer thin film according to an embodiment of the present invention exhibit transmittance of 80% or more, and difference between transmittances thereof is negligible. Based on these results, it can be confirmed that the highly conductive PEDOT:PSS polymer thin film (second treatment: pyronin B) manufactured by the method of manufacturing a highly conductive polymer thin film according to an embodiment of the present invention may be used as a transparent electrode.

Figure 6:
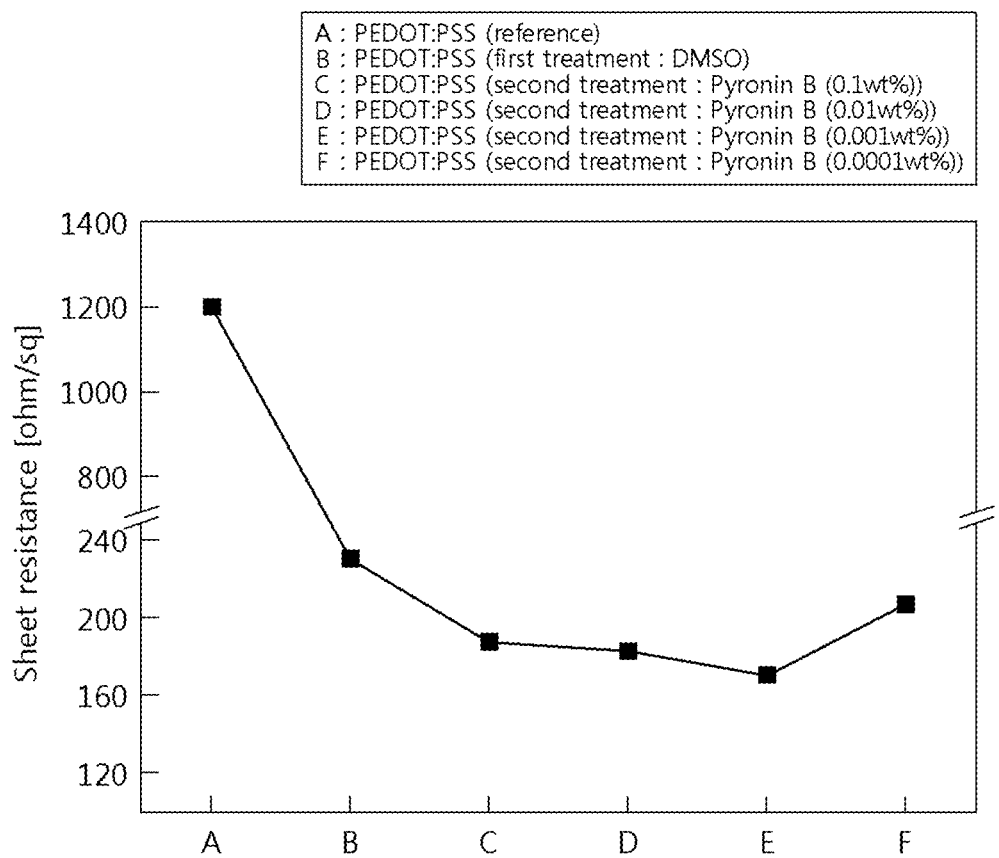
FIG. 6 is a graph showing change in the sheet resistance of a highly conductive polymer thin film manufactured by a method of manufacturing a highly conductive polymer thin film according to an embodiment of the present invention.

FIG. 6 is a graph showing change in the sheet resistance of a highly conductive polymer thin film manufactured by a method of manufacturing a highly conductive polymer thin film according to an embodiment of the present invention.

FIG. 6 shows the sheet resistance of the PEDOT:PSS polymer thin film (A) that has not been subjected to conductive treatment; the sheet resistance of the conductive PEDOT:PSS polymer thin film (B) that has been subjected only to the first conductive treatment; the sheet resistance of the highly conductive PEDOT:PSS polymer thin film (C) including 0.1 wt % of pyronin B manufactured by the method of manufacturing a highly conductive polymer thin film according to an embodiment of the present invention; the sheet resistance of the highly conductive PEDOT:PSS polymer thin film (D) including 0.01 wt % of pyronin B manufactured by the method of manufacturing a highly conductive polymer thin film according to an embodiment of the present invention; the sheet resistance of the highly conductive PEDOT:PSS polymer thin film (E) including 0.001 wt % of pyronin B manufactured by the method of manufacturing a highly conductive polymer thin film according to an embodiment of the present invention; and the sheet resistance of the highly conductive PEDOT:PSS polymer thin film (F) including 0.0001 wt % of pyronin B manufactured by the method of manufacturing a highly conductive polymer thin film according to an embodiment of the present invention.

Referring to FIG. 6, the PEDOT:PSS polymer thin film (A) that has not been subjected to conductive treatment has a sheet resistance of 1,000Ω/□, which is a basic value. However, in the case of the conductive PEDOT:PSS polymer thin film (B) that has been subjected to the first conductive treatment has a sheet resistance of 231Ω/□, showing decrease in sheet resistance.

Furthermore, when the highly conductive PEDOT:PSS polymer thin films manufactured by the method of manufacturing a highly conductive polymer thin film according to an embodiment of the present invention are subjected to the second conductive treatment using various concentrations (0.1 wt %, 0.01 wt %, 0.001 wt %, and 0.0001 wt %) of pyronin B, the sheet resistances thereof are 187.7 Ω/□, 182.91 Ω/□, 170.4Ω/□, and 207.9Ω/□, respectively, showing significant decrease in sheet resistance.

Although the sheet resistance of the highly conductive PEDOT:PSS polymer thin film (F) including 0.0001 wt % of pyronin B manufactured by the method of manufacturing a highly conductive polymer thin film according to an embodiment of the present invention decreases and then increases again, the increased value is smaller than the sheet resistance values of the PEDOT:PSS polymer thin film (A) that has not been subjected to conductive treatment and the conductive PEDOT:PSS polymer thin film (B) that has been subjected only to the first conductive treatment.

In particular, it can be confirmed that, in the case of the highly conductive PEDOT:PSS polymer thin film manufactured by the method of manufacturing a highly conductive polymer thin film according to an embodiment of the present invention, when the second conductive treatment is performed using 0.001 wt % of pyronin B, an optimum sheet resistance value of 170Ω/□ is exhibited.

Meanwhile, embodiments of the present invention disclosed in the present specification and drawings are only provided to aid in understanding of the present invention and the present invention is not limited to the embodiments. It will be apparent to those skilled in the art that various modifications can be made to the above-described exemplary embodiments of the present invention without departing from the spirit and scope of the invention.

The invention claimed is:

1. A method of manufacturing a conductive polymer thin film, comprising:
a step of coating a substrate with a first dopant solution comprising a polymer material and a first dopant to form a first conductive polymer thin film subjected to first conductive treatment; and
a step of performing second conductive treatment using a second dopant solution comprising pyronin B on the first conductive polymer thin film to form a second conductive polymer thin film, wherein conductivity of the second conductive polymer thin film is higher than that of the first conductive polymer thin film, and
wherein the pyronin B separates phases of the polymer material to induce connection between grains.

2. The method according to claim 1, wherein a sheet resistance of the second conductive polymer thin film is controlled by a concentration of the pyronin B.

3. The method according to claim 1, wherein a volume ratio of the polymer material to the first dopant is 10:1.

4. The method according to claim 1, further comprising a first heat treatment step of heat-treating, at a temperature of 120° C. to 150° C., the first conductive polymer thin film that has been subjected to the first conductive treatment.

5. The method according to claim 1, further comprising a second heat treatment step of heat-treating, at a temperature of 120° C. to 150° C., the second conductive polymer thin film that is the first conductive polymer thin film that has been subjected to the second conductive treatment.

6. The method according to claim 1, further comprising a step of performing patterning of the second conductive polymer thin film to form transparent electrodes.

7. The method according to claim 1, wherein the polymer material comprises at least one of polythiophene-based materials, polypyrrole-based materials, polyphenylene-based materials, polyaniline-based materials, and polyacetylene-based materials.

8. The method according to claim 1, wherein the polymer material is polyethylene dioxythiophene:polystyrene sulfonate (PEDOT:PSS).

9. The method according to claim 1, wherein the first dopant is a polar solvent comprising at least one of dimethyl sulfoxide (DMSO), diethylene glycol monoethyl ether, isophorone, propylene carbonate, cyclohexanone, butyrolactone, hydrochloric acid (HCl), N-methylpyrrolidone (NMP), N,N-dimethylformamide (DMF), and N-dimethylacetamide (DMA).

10. The method according to claim 1, wherein the substrate comprises at least one of glass, quartz, sapphire, aluminum oxide ($Al_2O_3$), polydimethylsiloxane (PDMS), polyethersulfone (PES), polyethylene naphthalate (PEN), polystyrene, polyethylene terephthalate (PET), polyamide (PI), polyvinyl chloride (PVC), polyvinylpyrrolidone (PVP), polyethylene (PE), polyacrylic acid, polyester (PS), and polyurethane (PU).

11. The method according to claim 1, wherein the first conductive polymer thin film is formed using at least one of blade coating, bar coating, spray coating, spin coating, brush coating, dip coating, and gravure coating.

12. The method according to claim 1, wherein the step of forming the second conductive polymer thin film is performed using a dipping method or a spraying method.

13. The method according to claim 1, wherein a sheet resistance value of the second conductive polymer thin film is 200 Ω/□ or less.

14. A method of manufacturing a conductive polymer thin film, comprising:
a step of coating a substrate with a first dopant solution comprising a polymer material and a first dopant to form a first conductive polymer thin film subjected to first conductive treatment; and
a step of performing second conductive treatment using a second dopant solution comprising pyronin B on the first conductive polymer thin film to form a second conductive polymer thin film, wherein conductivity of the second conductive polymer thin film is higher than that of the first conductive polymer thin film,
wherein a sheet resistance of the second conductive polymer thin film is controlled by a concentration of the pyronin B, and
wherein the concentration of the pyronin B is 0.0001 wt % to 0.1 wt %.

15. A method of manufacturing a conductive polymer thin film, comprising:
a step of coating a substrate with a first dopant solution comprising a polymer material and a first dopant to form a first conductive polymer thin film subjected to first conductive treatment; and
a step of performing second conductive treatment using a second dopant solution comprising pyronin B on the first conductive polymer thin film to form a second conductive polymer thin film, wherein conductivity of the second conductive polymer thin film is higher than that of the first conductive polymer thin film, and
wherein the second dopant solution further comprises the first dopant.

* * * * *